(12) United States Patent
Zhang et al.

(10) Patent No.: US 9,735,023 B2
(45) Date of Patent: *Aug. 15, 2017

(54) METHODS FOR MANUFACTURING BLOCK COPOLYMER COMPOSITIONS AND ARTICLES MANUFACTURED THEREFROM

(71) Applicants: DOW GLOBAL TECHNOLOGIES LLC, Midland, MI (US); ROHM AND HAAS ELECTRONIC MATERIALS LLC, Marlborough, MA (US)

(72) Inventors: Jieqian Zhang, Southborough, MA (US); Phillip D. Hustad, Watertown, MA (US); Peter Trefonas, III, Medway, MA (US); Mingqi Li, Shrewsbury, MA (US); Valeriy V. Ginzburg, Midland, MI (US); Jeffrey D. Weinhold, Lake Jackson, TX (US)

(73) Assignees: DOW GLOBAL TECHNOLOGIES LLC, Midland, MI (US); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/745,551

(22) Filed: Jun. 22, 2015

(65) Prior Publication Data
US 2015/0376408 A1 Dec. 31, 2015

Related U.S. Application Data

(60) Provisional application No. 62/018,266, filed on Jun. 27, 2014.

(51) Int. Cl.
| | | |
|---|---|---|
| *C08L 83/10* | (2006.01) | |
| *C08L 25/08* | (2006.01) | |
| *H01L 21/311* | (2006.01) | |
| *C09D 183/10* | (2006.01) | |
| *G03F 7/00* | (2006.01) | |
| *H01L 21/033* | (2006.01) | |
| *C08G 77/442* | (2006.01) | |
| *B82Y 40/00* | (2011.01) | |
| *B82Y 30/00* | (2011.01) | |

(52) U.S. Cl.
CPC .......... *H01L 21/311* (2013.01); *C09D 183/10* (2013.01); *G03F 7/0002* (2013.01); *H01L 21/0332* (2013.01); *H01L 21/31116* (2013.01); *H01L 21/31138* (2013.01); *B82Y 30/00* (2013.01); *B82Y 40/00* (2013.01); *C08G 77/442* (2013.01); *C08L 25/08* (2013.01); *C08L 2205/025* (2013.01); *C08L 2205/035* (2013.01)

(58) Field of Classification Search
None
See application file for complete search history.

(56) References Cited

U.S. PATENT DOCUMENTS

| | | |
|---|---|---|
| 8,518,835 B2 | 8/2013 | Sills |
| 8,641,914 B2 | 2/2014 | Regner |
| 8,710,150 B2 | 4/2014 | Chang |
| 2008/0176767 A1 | 7/2008 | Millward |
| 2012/0183742 A1 | 7/2012 | Black et al. |
| 2013/0034811 A1 | 2/2013 | Peeters et al. |
| 2013/0209344 A1 | 8/2013 | Chang |
| 2015/0030971 A1* | 1/2015 | Navarro ............... G03F 7/0002 430/5 |

FOREIGN PATENT DOCUMENTS

| | | |
|---|---|---|
| JP | 2010053263 A | 3/2010 |
| WO | 2012071330 A1 | 5/2012 |

OTHER PUBLICATIONS

Chi-Chun Liu, et al. "Fabrication of Lithographically Defined Chemically Patterned Polymer Brushes and Mats" Macromolecules 2011, 44, 1876-1885.
Christopher M. Bates, et al. "Polarity-Switching Top Coats Enable Orientation of Sub-10-nm Block Copolymer Domains" Science, 338, 775-779, Nov. 9, 2012.
Jeong Gon Son, et al. "High-Aspect-Ratio Perpendicular Orientation of PS•b•PDMS Thin Films under Solvent Annealing" ACS Macro Lett. 2012, 1, 1279-1284.
Mark P. Stoykovich, et al. "Directed Assembly of Block Copolymer Blends into Nonregular Device-Oriented Structures" Science, 308, 1442-46, Jun. 3, 2005.
Seung Hyun Kim, et al. "Highly Oriented and Ordered Arrays from Block Copolymers via Solvent Evaporation" Adv. Mater. 2004, 16 No. 3, Feb. 3, 2003, pp. 226-231.
Shengxiang Ji, et al. "Generalization of the Use of Random Copolymers to Control the Wetting Behavior of Block Copolymer Films" Macromolecules 2008, 41, 9098-9103.

(Continued)

*Primary Examiner* — Jeffrey Mullis
(74) *Attorney, Agent, or Firm* — Cantor Colburn LLP

(57) ABSTRACT

Disclosed herein is a composition comprising a first block copolymer that comprises a first block and a second block; where the first block has a higher surface energy than the second block; a second block copolymer that comprises a first block and a second block; where the first block of the first block copolymer is chemically the same as or similar to the first block of the second block copolymer and the second block of the first block copolymer is chemically the same as or similar to the second block of the second block copolymer; where the weight percent based on total solids of the first block of the second block copolymer is greater than that of the first block of the first block copolymer; where the first block copolymer phase separates into a first morphology of cylindrical or lamellar domains when disposed singly on a substrate.

10 Claims, 8 Drawing Sheets

(56) References Cited

OTHER PUBLICATIONS

T. Thurn-Albrecht, et al. "Ultrahigh-Density Nanowire Arrays Grown in Self-Assembled Diblock Copolymer Templates" Science, 290, 2126-29, Dec. 15, 2000.
Yoshida, H., et al. "Topcoat Approaches for Directed Self-Assembly of Strongly Segregating Block Copolymer Thin Films" Journal of Photopolymer Science and Technology, vol. 26, No. 1 (2013) pp. 55-58.

* cited by examiner

METHODS FOR MANUFACTURING BLOCK COPOLYMER COMPOSITIONS AND ARTICLES MANUFACTURED THEREFROM

CROSS REFERENCE TO RELATED APPLICATIONS

This U.S. Non-Provisional Application claims the benefit of U.S. Provisional Application Ser. No. 62/018,266, filed 27 Jun. 2014, the entire contents of which are hereby incorporated by reference.

BACKGROUND

This disclosure is related to block copolymers, methods of manufacture thereof and to articles comprising the same. In particular, this disclosure is related to block copolymers used for improved nano lithography patterning.

Modern electronic devices are moving toward utilization of structures that have a periodicity of less than 40 nanometers (nm). The ability to shrink the size and spacing of various features on a given substrate (e.g., gates in field effect transistors) is currently limited by the wavelength of light used to expose photoresists (i.e., 193 nm). These limitations create a significant challenge for the fabrication of features having a critical dimension (CD) of less than 40 nm.

Block copolymers have been proposed as one solution to formation of patterns with periodicity of less than 40 nanometers. Block copolymers form self-assembled nanostructures in order to reduce the free energy of the system. Nanostructures are those having average largest widths or thicknesses of less than 100 nanometers. This self-assembly produces periodic structures as a result of the reduction in free energy. The periodic structures can be in the form of domains, lamellae or cylinders. Because of these structures, thin films of block copolymers provide spatial chemical contrast at the nanometer-scale and, therefore, they have been used as an alternative low-cost nano-patterning material for generating periodic nanoscale structures.

Many attempts have been made to develop copolymers and processes for patterning. FIGS. 1A and 1B depict examples of lamella forming block copolymers that are disposed upon a substrate. The block copolymer comprises a block A and a block B that are reactively bonded to each other and that are immiscible with each other. The alignment of lamellae domains can be either parallel (FIG. 1A) or perpendicular (FIG. 1B) to the surface of a substrate surface upon which they are disposed. The perpendicularly oriented lamellae provide nanoscale line patterns, while there is no surface pattern created by parallel oriented lamellae.

Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns. Cylinder forming block copolymers, on the other hand, provide nanoscale line patterns when the cylinders form parallel to the surface and hole or post patterns when the cylinders form perpendicular to the surface. Therefore, to form a useful pattern, control of the orientation of the self-assembled microdomains in the block copolymer is desirable.

Directed Self-Assembly (DSA) of block copolymers is one method of advanced patterning technologies that enable sub-10 nm technology nodes. One of the leading DSA processes, chemoepitaxy, involves a chemical pattern to align lamellar block copolymer morphologies. Poly(styrene-block-methyl methacrylate) (PS-b-PMMA) has been widely studied in DSA using chemoepitaxy to demonstrate the potential of DSA to extend optical lithography. However, the relative weak segregation strength (low Flory-Huggins interaction parameter $\chi$) and weak etch selectivity of PS-b-PMMA limits its capability to pattern small features (less than 11 nm) with low line edge roughness (LER) and effective pattern transfer. Block copolymers with stronger segregation strength (high $\chi$) and higher etch selectivity may be useful at sub-10 nm nodes. The main challenges in developing formulations and processes for high $\chi$ lamellar block copolymer lie in the mismatched surface energies between the two blocks at the air interface, which drives the lamellae to align parallel (FIG. 2B) rather than perpendicular (FIG. 2A) to the substrate. A few approaches have been developed to overcome the unbalanced surface energy of high $\chi$ materials in DSA, such as using external fields (e.g., electrical, magnetic or mechanical).

Solvent evaporation in conjunction with an electrical field is one way of applying an external field to direct the block copolymer to align perpendicular to the substrate. Another method of directing alignment in block copolymers includes physically placing a layer of neutral material on top of the block copolymer, or spin coating a polarity switching top coat that is neutral to both blocks during thermal annealing. It is difficult however, to incorporate and reproducibly control the external alignment fields or physical placement (of the top layer) on track in industrial scale fabrication, while the polarity switching top coat cannot withstand the high annealing temperature (greater than 200° C.) to satisfy the high throughput requirement (within minutes of thermal annealing) in semiconductor industry.

It is therefore desirable to find block copolymers that can generate self-assembled films having domain sizes of less than 25 nanometers with a periodicity of less than 50 nanometers. Additionally, it is desirable to find block copolymers that contain highly etch resistant domains that can deliver low defects at 50 nm or less pitch under thermal annealing processes without a metal staining process, as this would save additional expensive processing steps and should lead to lower (better) line width roughness.

SUMMARY

Disclosed herein is a composition comprising a first block copolymer that comprises a first block and a second block; where the first block has a higher surface energy than the second block; a second block copolymer that comprises a first block and a second block; where the first block of the first block copolymer is chemically the same as or similar to the first block of the second block copolymer and the second block of the first block copolymer is chemically the same as or similar to the second block of the second block copolymer; where the weight percent based on total solids of the first block of the second block copolymer is greater than that of the first block of the first block copolymer; where the first block copolymer phase separates into a first morphology of cylindrical or lamellar domains when disposed singly on a substrate; where the second block copolymer phase separates into a second morphology of cylindrical, lamellar or spherical domains when singly disposed on a substrate; and where the first morphology and the second morphology are different; and a first polymer that is chemically the same as or similar to the first block of the first block copolymer and to the first block of the second block copolymer; and a second polymer that is chemically the same as or similar to the second block of the first block copolymer and to the second block of the second block copolymer; where the first and the second block copolymer have a chi parameter greater than 0.04 at a temperature of 200° C.

Disclosed herein too is a method comprising disposing upon a substrate the aforementioned composition, annealing the composition and removing a portion of the composition to form a pattern.

BRIEF DESCRIPTION OF THE FIGURES

FIG. 2(B) is a schematic diagram showing a perpendicular orientation of lamellar block copolymers;

FIG. 2(C) is a schematic diagram showing a hybrid parallel-perpendicular orientation of the composition of this disclosure; the composition shows only a single parallel layer with one surface of the parallel domains contacting air;

DETAILED DESCRIPTION

Figure 1:
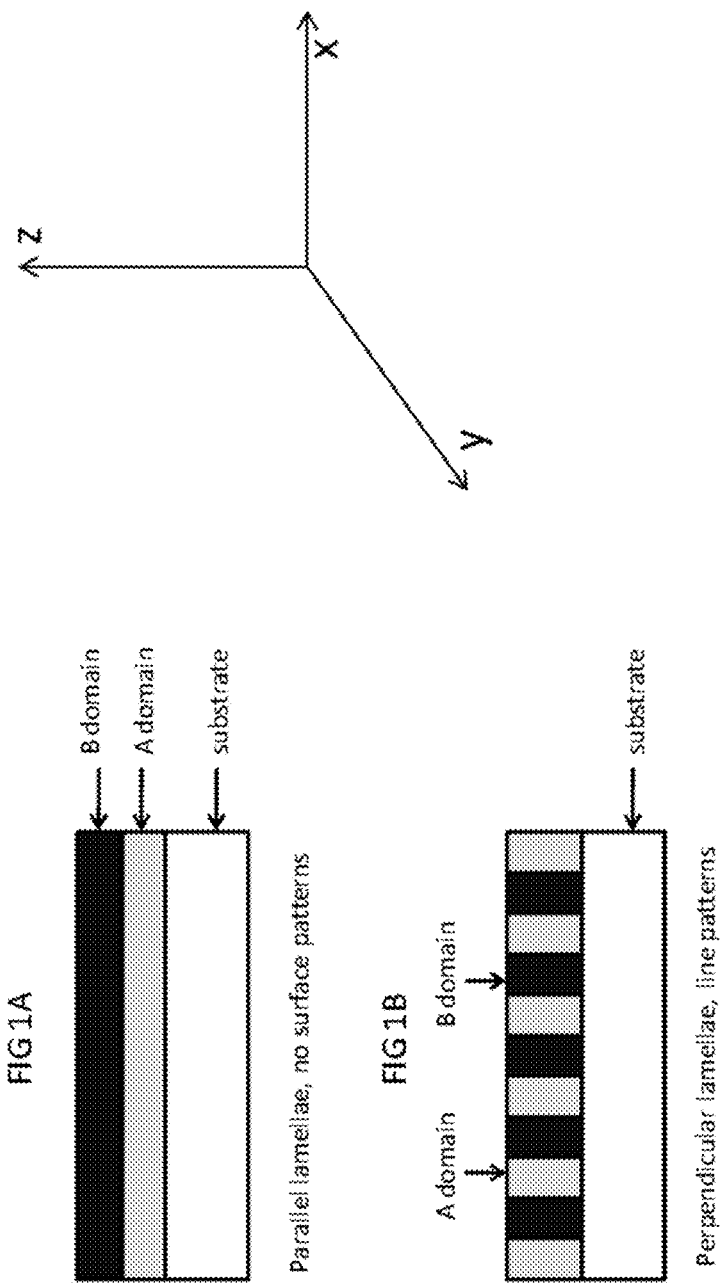
FIGS. 1(A) and 1(B) depict examples of lamella forming block copolymers that are disposed upon a substrate.

Disclosed herein is a composition that can produce a stable perpendicularly oriented block copolymer when disposed upon a substrate. The composition comprises a plurality of block copolymers having blocks of different molecular weights that are similar in chemical character, a first polymer that has a chemical character similar to one of the blocks of the block copolymer and a second polymer that has a chemical character similar to the other block of the block copolymer. In one embodiment, the composition comprises a first block copolymer that comprises a first block and a second block, where the first block copolymer has a higher molecular weight than a second block copolymer that comprises the first block and the second block (where at least one of the first block or the second block of the second block copolymer is of a lower molecular weight than the first block or the second block respectively of the second block copolymer).

The composition disclosed herein is advantageous in that it is capable of handling high temperature annealing necessary for high throughput fabrication. By blending the four components (shown in the Table 1 below) at the appropriate compositions and molecular weights, a hybrid perpendicular orientation can be stabilized in the film with parallel orientation dominating at the top of the film and perpendicular orientation dominating at the bottom of the film as shown in the FIG. 2(C). After the paralleled portion on the top is removed (e.g., with a plasma etch or a chemical etch) the remaining perpendicular lamellae can be used as a mask for effective pattern transfer.

The first and second block of the first and second block copolymers are chemically dissimilar and are characterized by an energetic penalty of dissolving one block into the other block. This energetic penalty is characterized by the Flory-Huggins interaction parameter or "chi" (denoted by $\chi$) and is an important factor in determining microphase segregation behavior in block copolymers. Accordingly, the $\chi$ value of a block copolymer defines a tendency of the block copolymer to segregate into microdomains as a function of the block copolymer's weight, chain length, and/or degree of polymerization. The chi parameter can often be approximated from the square of the difference in Hildebrand solubility parameters of the respective polymers of the block copolymer. In one embodiment, the chi parameter has a value greater than 0.04 at a temperature of 200° C. In an exemplary embodiment, the chi parameter has a value greater than 0.1 at a temperature of 200° C. Conversely, polymers that are chemically similar are characterized by a lack of an energetic penalty of dissolving one polymer into the other polymer. In short, polymers that are chemically similar to each other do not have identical chemical structures but are compatible with each other. They are miscible with each other and are characterized by a low or zero energetic penalty when one polymer is mixed with the other (e.g., poly(2-ethylhexylmethacrylate) and poly(hexylmethacrylate).

In one embodiment, the first block copolymer and the second block copolymer always have different morphologies when separately cast upon a substrate. For example, the first block copolymer may have a cylindrical or lamellar morphology when cast alone upon a substrate. The second block can have either a cylindrical, lamellar or spherical morphology when cast alone upon a substrate. However, in order to produce the claimed invention, it is desirable that the morphology of the first block copolymer when disposed alone on a substrate be different from the morphology of the second block copolymer when disposed alone on another substrate.

For example, if the first block copolymer has a cylindrical morphology when cast alone on a substrate, then it is desirable to pick a second block copolymer that has a molecular weight that results in it having a spherical or lamellar morphology when disposed alone on a different by equivalent substrate. Similarly, if the second block copolymer has a lamellar morphology when cast alone on a substrate, then it is desirable to pick a second block copolymer that has a molecular weight that results in it having a spherical or cylindrical morphology when disposed alone on a different by equivalent substrate.

As used herein, the $\chi$ parameter denotes the segment-segment interaction parameter associated with a segment volume of 0.118 cubic nanometers (nm3). The molecular weight of a segment, mo, in units of g/mol is equal to the segment volume multiplied by the polymer density and divided by Avogadro's number. Also as used herein, the degree of polymerization, N, is defined as the number of segments per block copolymer molecule and $MN=N \times mo$.

A greater chi parameter between the first block of the copolymer with respect to the second block of the copolymer promotes the formation of smaller, highly periodic lamellar and/or cylindrical domains, which can be used to produce periodic structures in a substrate upon which the copolymer is disposed. In an exemplary embodiment, the periodic structures in the substrate are produced via nano-lithography. In one embodiment, the first block of the first and second block copolymers is a block derived from a vinyl aromatic monomer while the second block of the first and second block copolymers is derived from a siloxane monomer.

Disclosed herein too is a method for manufacturing the block copolymer. The method involves using controlled or living polymerization to synthesize the first block of the copolymer. The second block of the copolymer may have a narrow polydispersity index and is generally synthesized by controlled or living polymerization in the same reactor as the first block of the copolymer. The first block and second block of the copolymer can also be made in separate reactors and then reacted with each other to form the block copolymer.

In one embodiment, the first block copolymer comprises a first block (i.e., a first polymer block) and a second block (i.e., a second polymer block) that has a higher molecular weight than the first block and the second block respectively of the second block copolymer. The molecular weight can be a number average molecular weight or a weight average molecular weight. The first block copolymer thus has a higher molecular weight than the second block copolymer. In one embodiment, the composition may comprise a third block copolymer, a fourth block copolymer, and so on where at least one of the blocks has a different molecular weight from the molecular weight of a block (having the same chemical structure) in the first block copolymer or the second block copolymer.

The block copolymer can be a multiblock copolymer. In one embodiment, the multiblocks can include diblocks, triblock, tetrablocks, and so on. The blocks can be part of a linear copolymer, a branched copolymer where the branches are grafted onto a backbone (these copolymers are also sometimes called "comb copolymers"), a star copolymer, or the like. In an exemplary embodiment, the block copolymer is a linear diblock copolymer.

The first block of the block copolymers (i.e., the first block copolymer and the second block copolymer) may be a polystyrene, a poly(meth)acrylate, a polyolefin, a polyacrylic, a polycarbonate, a polyester, a polyamide, a polyamideimide, a polyvinyl ether, a polyvinyl thioether, a polyvinyl alcohol, a polyurea, a poly(vinyl pyridine), a poly(vinyl imidazole), a poly(vinyl pyrazole), or the like, or a combination thereof. An exemplary first block is polystyrene (i.e., derived from a vinyl aromatic monomer) or polyacrylate (i.e., derived from an ethylenically saturated monomer).

The first block is derived from a vinyl aromatic monomer. In one embodiment, the vinyl aromatic monomer is styrene. In another embodiment, the vinyl aromatic monomers that can be polymerized to produce the first block of the first and second block copolymer are alkylstyrenes. Examples of suitable alkylstyrenes are o-methylstyrene, p-methylstyrene, m-methylstyrene, α-methylstyrene, ethylstyrene, α-methyl-p-methylstyrene, 2,4-dimethylstyrene, monochlorostyrene, p-tert-butylstyrene, 4-tert-butylstyrene, or the like, or a combination comprising at least one of the foregoing alkylstyrene monomers. An exemplary alkylstyrene monomer is p-tert-butylstyrene. Another exemplary alkylstyrene is 4-tert-butylstyrene. An exemplary first block polymer is poly(4-tertbutyl styrene). In one embodiment, the first block polymer may contain about 2 to about 10 weight percent vinyl aromatic species that are not derived from 4-tert-butylstyrene.

In another embodiment, the first block is derived from an acrylate monomer. In one embodiment, the first repeat unit (i.e., the acrylate monomer) has a structure derived from a monomer represented by formula (1):

where $R_1$ is a hydrogen or an alkyl group having 1 to 10 carbon atoms. Examples of the first repeat monomer are acrylates and alkyl acrylates such as, for example, methyl acrylates, ethyl acrylates, propyl acrylates, or the like, or a combination comprising at least one of the foregoing acrylates.

In one embodiment, the first repeat unit has a structure derived from a monomer having a structure represented by the formula (2):

where $R_1$ is a hydrogen or an alkyl group having 1 to 10 carbon atoms and $K_2$ is a $C_{1-10}$ alkyl, a $C_{3-10}$ cycloalkyl, or a $C_{7-10}$ aralkyl group. Examples of the (meth)acrylates are methacrylate, ethacrylate, propyl acrylate, methyl methacrylate, methyl ethylacrylate, methyl propylacrylate, ethyl ethylacrylate, methyl arylacrylate, or the like, or a combination comprising at least one of the foregoing acrylates. The term "(meth)acrylate" implies that either an acrylate or methacrylate is contemplated unless otherwise specified. An exemplary monomer for the first block is methyl methacrylate. An exemplary first BLOCK is polymethylmethacrylate.

The polydispersity index of the first block is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min).

The molecular weight of the first block of the first block copolymer is selected based upon the target pitch of the copolymer when it is disposed upon a substrate. The pitch is the average center to center distance between successive domains of a particular block when the composition is disposed upon a substrate. The pitch generally increases with increasing molecular weight and so controlling the molecular weight of the first block can be used to control the pitch.

The first block of the first and second block copolymers have end groups reacted onto it. Examples of end groups are reactive functionalities such as azides, acetylenes, alkyl acid chlorides, alkyl sulfonyl chlorides, alcohols, thiols or combinations thereof. Alternatively, the terminus of the first block is carefully maintained as a reactive initiator, such as an anion lithium salt, maintaining its reactivity for the polymerization of second block onto the first block.

The second block of the first block copolymer comprises a moiety that imparts a lower surface energy than the first block of the first block copolymer as well as etch selectivity with the first block of the first block copolymer. The rate of etch between the first and second blocks is different by at least a factor of two. In one embodiment, the second block of the first block copolymer has a slower etch rate than the first block of the first block copolymer. In other embodiments, the second block of the first block copolymer has a faster etch rate than the first block of the first block copolymer. Exemplary examples of the second block with high etch resistance are polymeric molecules comprising silicon. Examples of the second block of the first block copolymer are polysiloxane, silicon-containing polystyrenes, silicon-containing polyacrylates, poly(dimethylsilabutane)s, or combinations thereof.

In an exemplary embodiment, the second block of the first block copolymer is a block derived from a siloxane monomer having the structure of formula (3)

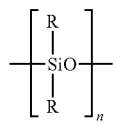
(3)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl. Combinations of the foregoing R groups can be present in the same monomer. The degree of POLYMERIZATION n in the formula (1) can be 10 to 5,000, specifically 30 to 3,000, more specifically 50 to 1,000.

Examples of styrene monomers that include pendent silicon atoms are represented by the formula (4)

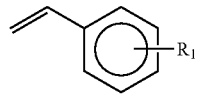
(4)

where $R_1$ is $SiR2$ where R2 is a C3-C10 alkyl, $OSiMe_2SiMe_3$, $O(SiMe_2)_2SiMe_3$, $SiMe_2SiMe_3$, $(SiMe_2)_2SiMe_3$, or the like.

Exemplary styrene monomers that include pendent silicon atoms are shown in the formulas (5), (6) and (7):

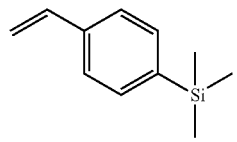
(5)

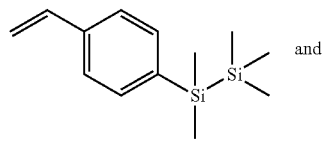
(6)
and

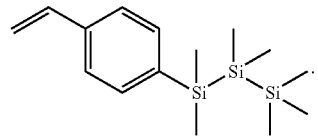
(7)

Examples of acrylate monomers that include pendent silicon atoms are represented by the formula (8)

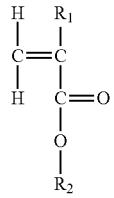
(8)

where $R_2$ contains a silicon, specifically $R_2$=SiR3, C3-C10 alkyl, $OSiMe_2SiMe_3$, $O(SiMe_2)_2SiMe_3$, $SiMe_2SiMe_3$, $(SiMe_2)_2SiMe_3$, $CH_2SiMe_3$, $CH(SiMe_3)_2$, or the like.

Exemplary acrylate monomers that include pendent silicon atoms are shown in the formulas (9)-(17):

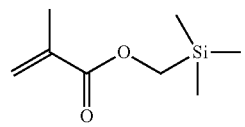
(9)

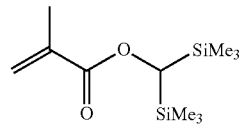
(10)

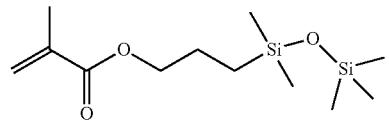
(11)

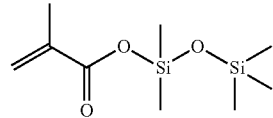
(12)

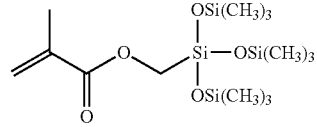
(13)

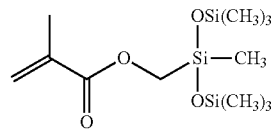
(14)

-continued

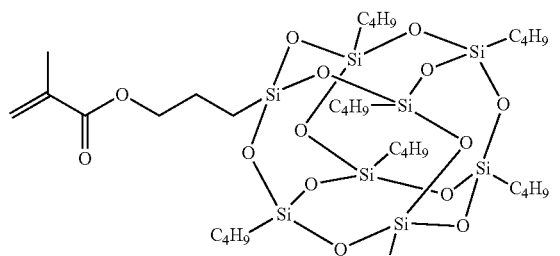

(15)

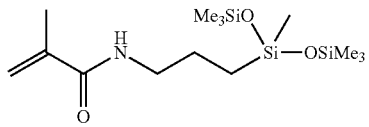

(16)

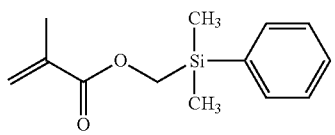

(17)

The composition when disposed on the substrate can form either line/space or hole/post patterns. When line space patterns are desired, the first block copolymer is selected with a composition and molecular weight that result in formation of a lamellar morphology when disposed singularly on a substrate and annealed to form domains. In this case, the first block copolymer has a number average molecular weight of 2000 to 100000 grams per mole. In a preferred embodiment, the first block copolymer has a number average molecular weight of 7000 to 50000 grams per mole. The second block of the first block copolymer is present in the first block copolymer in an amount sufficient to form a lamellar-type pattern, 35 to 65 wt %, specifically 40 to 60 wt %, based on the total weight of the first block copolymer.

The second block copolymer is selected to have a composition that, when disposed singularly on a substrate, forms a different morphology that the first block copolymer. When line space patterns are desired, the second copolymer is selected with a composition and molecular weight that result in formation of a cylindrical or spherical morphology when disposed singularly on a substrate and annealed to form domains. In this case, the second block copolymer has a number average molecular weight of 500 to 50000 grams per mole. In a preferred embodiment, the second block copolymer has a number average molecular weight of 2500 to 26000 grams per mole. The second block of the second block copolymer is present in the second block copolymer in an amount of 10 to 35 wt %, specifically 25 to 30 wt %, based on the total weight of the first block copolymer.

The first block copolymer is present in the composition in an amount of 35 to 65 wt %, preferably 40 to 60 wt %, based on the total weight of the composition. The second block copolymer is present in the composition in an amount of 18 to 38 wt %, preferably 23 to 33 wt %, based on the total weight of the composition.

The first polymer has the same chemical composition as or is chemically similar to the first block of the first and second block copolymers. For example, the first polymer is polystyrene if the first block of the first and second block copolymers is polystyrene. The first polymer is added to the composition to tune pitch of the composition when it is disposed on a substrate. It can also be used to improve kinetics.

The second polymer has the same chemical composition as or is chemically similar to the second block of the first and second block copolymers. For example, the second polymer is polydimethylsiloxane if the second block of the first and second block copolymers is polydimethylsiloxane. The second block is used to adjust the overall composition and it is also used to tune the pitch of the composition when disposed on a substrate.

The first polymer has a number average molecular weight that is ⅓ to 1 of the first block of the first block copolymer. The first polymer generally has a number average molecular weight of 1500 to 25000 grams per mole. In a preferred embodiment, the first polymer has a number average molecular weight of 2000 to 20000 grams per mole. The second polymer has a number average molecular weight that is 2000 grams per mole to ½ the molecular weight in grams per mole of the second block of the first block copolymer. The second polymer generally has a number average molecular weight of 2000 to 16000 grams per mole. In a preferred embodiment, the second polymer has a number average molecular weight of 2000 to 6000 grams per mole.

When hole or post patterns are desired, the first block copolymer is selected with a composition and molecular weight that result in formation of a cylindrical morphology when disposed singularly on a substrate and annealed to form domains. In this case, the first block copolymer has a number average molecular weight of 2000 to 100000 grams per mole. In a preferred embodiment, the first block copolymer has a number average molecular weight of 3600 to 52000 grams per mole. The second block of the first block copolymer is present in the first block copolymer in an amount sufficient to form a cylindrical morphology, in an amount of 15 to 35 wt %, specifically 20 to 30 wt %, based on the total weight of the first block copolymer.

The second block copolymer is selected with a composition and molecular weight that result in formation of a spherical morphology when disposed singularly on a substrate and annealed to form domains. The second block copolymer has a number average molecular weight of 500 to 50000 grams per mole. In a preferred embodiment, the second block of the second block copolymer has a number average molecular weight of 1700 to 48000 grams per mole. The second block of the second block copolymer is present in the second block copolymer in an amount of 5 to 25 wt %, specifically 10 to 20 wt %, based on the total weight of the first block copolymer.

The first block copolymer is present in the composition in an amount of 35 to 65 wt %, preferably 40 to 60 wt %, based on the total weight of the composition. The second block copolymer is present in the composition in an amount of 18 to 38 wt %, preferably 23 to 33 wt %, based on the total weight of the composition.

The first polymer has the same chemical composition as or is chemically similar to the first block of the first and second block copolymers. For example, the first polymer is polystyrene if the first block of the first and second block copolymers is polystyrene. The first polymer is added to the composition to tune pitch of the composition when it is disposed on a substrate. It can also be used to improve kinetics.

The second polymer has the same chemical composition as or is chemically similar to the second block of the first and second block copolymers. For example, the second polymer is polydimethylsiloxane if the second block of the first and second block copolymers is polydimethylsiloxane. The second block is used to adjust the overall composition and it is also used to tune the pitch of the composition when disposed on a substrate.

The first polymer has a number average molecular weight that is 1/3 to 1 of the first block of the first block copolymer. The first polymer generally has a number average molecular weight of 500 to 40000 grams per mole. In a preferred embodiment, the first polymer has a number average molecular weight of 1000 to 40000 grams per mole. The second polymer has a number average molecular weight that is 2000 grams per mole to 1/2 the molecular weight in grams per mole of the second block of the first block copolymer. The second polymer generally has a number average molecular weight of 2000 to 12000 grams per mole. In a preferred embodiment, the second polymer has a number average molecular weight of 1000 to 8000 grams per mole.

The first polymer is present in the composition in an amount of 1 to 20 wt %, preferably 5 to 15 wt %, based on the total weight of the composition. The second polymer is present in the composition in an amount of 1 to 20 wt %, preferably 5 to 15 wt %, based on the total weight of the composition.

It is to be noted that the first and the second polymers can comprise blends of polymers of different molecular weights. For example, the first polymer may comprise a blend of two or more polymers having the same chemical composition but having different molecular weights. Similarly, the second polymer may comprise a blend of two or more polymers having the same chemical composition but having different molecular weights.

The first block and the second block of the first and second block copolymers both have a narrow polydispersity index and as a result form block copolymers that display a high degree of periodicity. The copolymers have lamellar and/or cylindrical morphologies and can align perpendicular to the surface of a substrate upon which they are disposed, thus making them useful for advanced semiconductor patterning. These block copolymers can be used for creating features on a substrate (upon which they are disposed) that are less than or equal to about 25 nanometers, specifically less than or equal to about 20 nanometers. The block copolymer can be further treated via annealing to self-assemble into morphologies that display improved long range order when compared with a comparative copolymer that has the same composition but is not annealed. This feature advantageously permits the block-copolymer to be used as a resist with variable interdomain spacings for different lithographic applications.

In one embodiment, in one method of manufacturing the composition, the first and the second block copolymers may be manufactured by sequential anionic polymerization or alternatively by manufacturing the two blocks (the first block and the second block) independently and then reacting them together to form the block copolymer. In an embodiment, click chemistry can be used to react the two blocks to form the block copolymer. For example, the first block that is derived from the polymerization of the vinyl aromatic species can be endcapped with an alkyne endgroup, while the second block derived from the polymerization of the siloxane can be endcapped with an azide endgroup. Click coupling can be used to react the first block with the second block to produce the block copolymer.

With further regard to click chemistry, one end of the polymerized siloxane monomer can contain an azide, an acetylene, an acid chloride or sulfonyl chloride, an alcohol, a thiol, or the like, provided that the group chosen is reactive to and forms a covalent bond with the reactive site on the terminus of the first block. The block copolymer is then formed by the reaction of the reactive terminus on the first block with the reactive terminus on the second block, yielding a linear block copolymer.

In another embodiment, anionic polymerization, which is a preferred mode for producing the first block of the respective block copolymers, may be used to react the living polystyryl-lithium with the corresponding cyclotrisiloxane (e.g. hexamethylcyclotrisiloxane, or D3, the polysiloxane precursor) directly. In another embodiment, a "reactivity attenuating agent", such as 2,2,5,5-tetramethyl-1-oxa-2,5-disilacyclopentane may be added to the living polystyryl-lithium before adding the cyclotrisiloxane.

In one preferred embodiment, the reactive anion lithium salt of the first block is directly used to initiate the polymerization of the second block. One preferred embodiment of this method uses direct ring opening polymerization of hexamethylcyclotrisiloxane or tetramethylcyclodisiloxane to form the polysiloxane. A more preferred embodiment first reacts the carefully maintained reactive anion lithium salt of the first block with 2,2,5,5-tetramethyldisilafuran, and then further polymerizes using direct ring opening polymerization of hexamethylcyclotrisiloxane or tetramethylcyclodisiloxane to form the polydimethylsiloxane.

The polydispersity index of the first and the second block copolymer is less than or equal to about 1.20, specifically less than or equal to about 1.15 and specifically less than or equal to about 1.10 when determined by size exclusion chromatography (SEC) with tetrahydrofuran (THF) as the mobile phase (at 35° C. and a flow rate of 1 mL/min).

The first and the second block copolymer can be manufactured in a batch process or in a continuous process. The batch process or the continuous process can involve a single or multiple reactors, single or multiple solvent and single or multiple catalysts (also termed initiators). In one embodiment, in one method of manufacturing the first and the second block copolymer, a first monomer is polymerized anionically to form the first block of the respective copolymers in a first reactor in the presence of a first solvent and a first initiator. A first endcapping agent is then introduced into the first reactor to quench the anionic reaction in the first reactor and to prevent undesirable side reactions.

The second monomer is subject to condensation polymerization to form the second block of the respective copolymers in the presence of a second solvent and a second catalyst. The second monomer may be obtained by the polymerization of a monomer or by the ring opening of a cyclic siloxane polymer followed by the condensation polymerization of the polymer to form the second block of the respective copolymers. The second block may be polymerized in a second reactor. When the second block has reached a desirable molecular weight, the reaction may be quenched using an acid or base to neutralize the catalyst. The first block and the second block are then covalently bonded to form the block copolymer. In one embodiment, the first block and the second block are then copolymerized (i.e., chemically (covalently) bonded) to form the block copolymer in the first reactor or the second reactor. The first reactor, the first solvent and the first initiator can be the same or different from the second reactor, the second solvent and the second initiator. In an exemplary embodiment, the first reactor, the first solvent and the first initiator are different from the second reactor, the second solvent and the second initiator.

Suitable solvents for conducting the reaction are polar solvents, non-polar solvents, or combinations thereof.

Examples of solvents are aprotic polar solvents, polar protic solvents, or non polar solvents. In one embodiment, aprotic polar solvents such as propylene carbonate, ethylene carbonate, butyrolactone, acetonitrile, benzonitrile, nitromethane, nitrobenzene, sulfolane, dimethylformamide, N-methylpyrrolidone, glycol ether acetates, propylene glycol monomethyl ether acetate, or the like, or combinations comprising at least one of the foregoing solvents may be used. In another embodiment, polar protic solvents such as water, methanol, acetonitrile, nitromethane, ethanol, propanol, isopropanol, butanol, or the like, or combinations comprising at least one of the foregoing polar protic solvents may also be used. Other non-polar solvents such a benzene, alkylbenzenes (such as toluene or xylene), methylene chloride, carbon tetrachloride, hexane, diethyl ether, tetrahydrofuran, or the like, or combinations comprising at least one of the foregoing solvents may also be used. Co-solvents comprising at least one aprotic polar solvent and at least one non-polar solvent may also be utilized to modify the swelling power of the solvent and thereby adjust the rate of reaction. In an exemplary embodiment, the first solvent is tetrahydrofuran. The solvent used for the block copolymer was propylene glycol monomethyl ether acetate (PGMEA).

The weight ratio of the solvent to the first monomer (used in the first block of the first and second block copolymers) is about 5:1 to about 20:1, specifically about 7:1 to about 15:1, and more specifically about 8:1 to about 12:1.

In order to initiate polymerization of the first monomer to form the first block of the copolymer, it is desirable to use a first initiator that can initiate anionic polymerization of a vinyl aromatic compound. The first initiator is an aliphatic hydrocarbon alkali metal compound, an aromatic hydrocarbon alkali metal compound, an organic aminoalkali metal compound, or the like, or a combination comprising at least one of the foregoing first initiators.

Examples of the alkali metals include lithium, sodium, potassium, or the like, or a combination comprising at least one of the foregoing alkali metals. In an exemplary embodiment, the organic alkali metal compounds include an aliphatic and/or aromatic hydrocarbon lithium compound comprising 1 to about 20 carbon atoms, a compound comprising one lithium atom in a single molecule or dilithium, trilithium and tetralithium compounds comprising a plurality of lithium atoms in a single molecule.

In an exemplary embodiment, the first initiator is n-propyllithium, n-butyllithium, sec-butyllithium, tert-butyllithium, hexamethylenedilithium, butadienyldilithium, isoprenyldilithium, a reaction product of diisopropenylbenzene and sec-butyllithium, a reaction product of divinylbenzene, sec-butyllithium and a small amount of 1,3-butadiene, or the like, or a combination comprising at least one of the foregoing first initiators. An exemplary first initiator is sec-butyllithium.

In one embodiment, the first initiator is used in an amount of about 20 to about 2000 moles per mole of the first monomer. In an exemplary embodiment, the first initiator is used in an amount of about 70 to about 300 moles per mole of the first monomer.

The first monomer is reacted to form the first block of the first and second block copolymers at a temperature of about −100° C. to about 150° C., specifically about −80° C. to about 100° C. Reaction temperature is selected for the polymerization chemistry in order to minimize side reactions and provide polymer with narrow dispersity. This reaction may be conducted under a vacuum or at an elevated pressure. In one embodiment, the pressure in the reaction vessel is about 0.05 to about 10 kilograms per square centimeter, specifically about 0.07 to about 2 kilograms per square centimeter. The pressure may be applied by using a pressurized inert gas such as nitrogen, argon, carbon dioxide or the like to the reactor.

In one embodiment, the respective block polymers may be purified by a variety of methods prior to be reacted to form the block copolymer. Purification of the respective block polymers is optional. In another embodiment, the reactants, the respective block polymers, and the block copolymer may be purified prior to and after the reaction. Purification may include washing, filtration, precipitation, ion exchange, decantation, centrifugation, distillation, or the like, or a combination comprising at least one of the foregoing methods of purification.

In one exemplary embodiment, all reactants including the solvents, initiators and endcapping agents are purified prior to the reaction. It is generally desirable to use reactants, solvents and initiators that are purified to an amount of greater than or equal to about 99 wt % purity, specifically greater than or equal to about 99.5 wt % purity and more specifically greater than about or equal to about 99.9 wt % purity. In another exemplary embodiment, after sequential polymerization of the block copolymers, the block copolymers may be subjected to purification by methods that include washing, filtration, ion exchange, precipitation, decantation, centrifugation or distillation.

In one embodiment, the block copolymers can contain anti-oxidants, anti-ozonants, mold release agents, thermal stabilizers, levelers, viscosity modifying agents, free-radical quenching agents, other polymers or copolymers such as impact modifiers, or the like.

The block copolymers after purification may be dissolved in a solvent along with the first and second polymers and then disposed upon the surface of a substrate to form a film upon annealing whose domains are perpendicular in orientation to the surface of the substrate. In one embodiment, the surface of the substrate may contain a surface modification layer disposed thereon prior to the disposing of the block copolymer onto the surface of the substrate. The surface modification layer can be a block copolymer, a random copolymer, of a blend of homopolymers and form brushes on the surface of the substrate. The substrate can also be patterned such that some areas result in perpendicular orientation while others induce a parallel orientation of the block copolymer domains. The substrate can also be patterned such that some regions selectively interact, or pin, a domain of the block copolymer to induce order and registration of the block copolymer morphology. The substrate can also have topography that induces the alignment and registration of one or more of the domains of the block copolymers.

The composition after being disposed upon the substrate is optionally heated to remove solvent, form the domains, and eliminate defects in an annealing process. The disposed composition is annealed above the glass transition temperature and below the order-disorder transition temperature and decomposition temperature of the composition. The glass transition temperature, $T_g$, of a polymer is the temperature above which the polymer transitions from a hard and relatively brittle state into a molten or rubber-like state and can be determined by techniques such as differential scanning calorimetry or dynamic mechanical analysis. The order-disorder transition temperature, $M_{ODT}$, is the temperature above which a block copolymer transitions from an ordered phase separated morphology into a disordered melt and can be determined by techniques such as dynamic mechanical analysis. The decomposition temperature of a polymer is the temperature at which the substance chemically decomposes and is generally determined by determined by thermogravimetric analysis. Annealing is performed to a temperature of up to 400° C. for up to 4 hours. In one embodiment, the annealing is performed under an atmosphere composed of nitrogen or argon and specifically devoid of oxygen. In an exemplary embodiment, the block copolymer is disposed upon the substrate and heated under nitrogen to a temperature of 220 to 360° C., specifically 250 to 320° C. for 0.5 minutes to 2 hours, specifically 1 minutes to 10 minutes. The annealing of the composition can be used to vary the interdomain spacing (i.e., the periodicity) of the cylindrical and/or lamellar domains. The size of the domains can also be varied by the temperature and time of the annealing.

In some embodiments, the domains of the composition form perpendicular to the substrate and the first block aligns to the pattern created on the first domain to the "pinning" feature on the substrate, and the second block forms a second domain on the substrate aligned adjacent to the first domain. Where the patterned substrate forms a sparse pattern, and hence the surface modification layer regions are spaced at an interval greater than an interval spacing of the first and second domains, additional first and second domains form on the surface modification layer to fill the interval spacing of the sparse pattern. The additional first domains, without a pinning region to align to, instead align perpendicular to the previously formed perpendicular orientation inducing surface modification layer and adjacent to the second domain aligned to the pinned first domain, and additional second domains align to the additional first domains.

In other embodiments, the domains of the composition are aligned in trench or hole patterns to form patterns with higher feature density than in the original guide pattern. For example, trenches are made using lithographic techniques, and then the trenches are filled with the block copolymer. After annealing, the composition aligns to form a plurality of cylinders inside the trench. These cylinders serve as etch masks and enable formation of multiple lines within the original trench. Spherical domains can also be aligned in holes or trenches to create an ordered array of dots or posts inside the original features.

Figure 2:
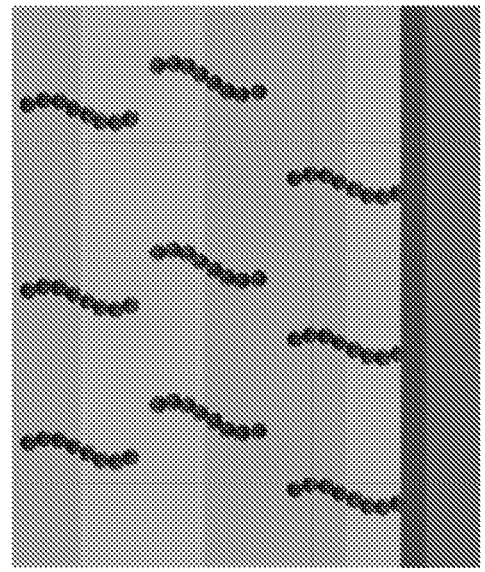
FIG. 2 (A) is a schematic diagram showing a perpendicular orientation of lamellar block copolymers.
Figure 2:
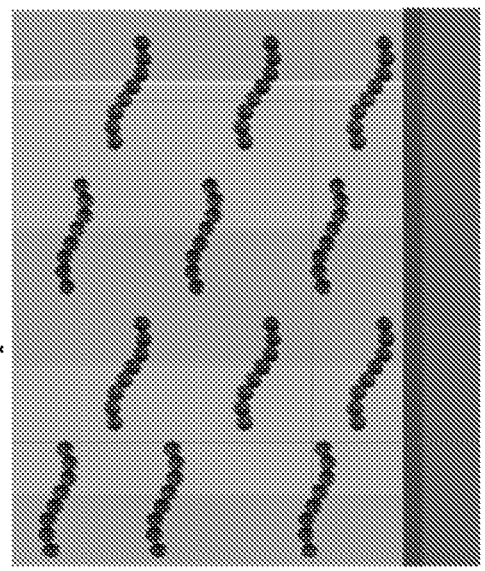
Figure 2:
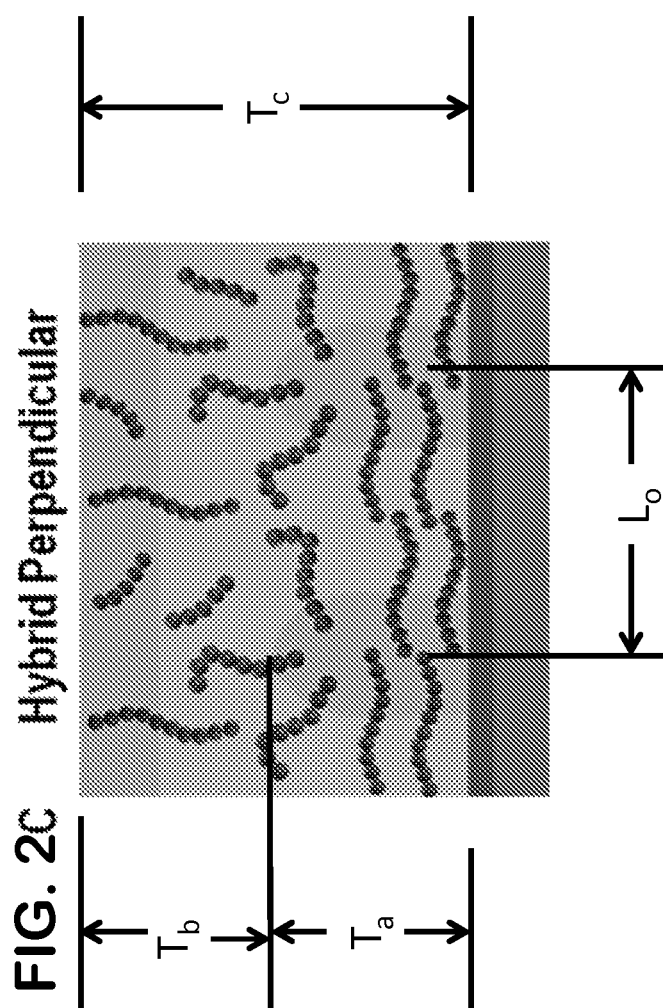

In a preferred embodiment, the morphology shown in the FIG. 2(C) is produced when the disclosed composition is disposed on a substrate and annealed. The article disclosed in the FIG. 2(C) comprises a first region having a thickness of $T_a$ that comprises alternating domains disposed perpendicular to the substrate surface and contacting the substrate; and a second region having a thickness of $T_b$ that comprises a single layer having two domains; where the single layer is oriented substantially parallel to the substrate surface, such that the first region and the second region have a total thickness of $T_c$; and where at least one layer of the second region contacts air while at least one of the domains of the second region directly contacts the first region; where the relationship between the thickness of the first region and the second region is expressed by Equation (1):

$$T_a = T_c - KL_o \qquad (1)$$

where Lo is a pitch between successive domains in the first region and were K is a constant having a value of 0.3 to 0.6 preferably 0.40 to 0.55.

A portion of the composition may then be removed to form a pattern, and one of the domains of the composition may be preferentially removed. A relief pattern may then be formed by removing either the first or second domain to expose an underlying portion of the surface modification layer. In an embodiment, the second region may be removed with a non-selective process such that both the first and second domains are removed, followed by removal of either the first or second domain from the first region to define a pattern. In an embodiment, removing is accomplished by a wet etch method, developing, or a dry etch method using a plasma such as an oxygen plasma. The composition with at least one domain removed is then used as a template to decorate or manufacture other surfaces that may be used in fields such as electronics, semiconductors, and the like.

The invention is further illustrated by the following non-limiting examples.

EXAMPLES

PS-b-PDMS block copolymers having a number average molecular weights indicated by 13.5-b-13.5 kg/mol and 6.1-b-8.7 kg/mol, where the first number corresponds to the number average molecular weight of the PS block and the second number to the number average molecular weight of the PDMS block, were generally synthesized by the procedure described by Chang et al. in US Pat. Publ. 20130209344 and outlined below. All other PS-b-PDMS block copolymers and PS and PDMS homopolymers were purchased from Polymer Source.

Synthesis of PS-b-PDMS Block Copolymers

Into a 500 mL round bottom reactor under an argon atmosphere was added cyclohexane and styrene. The contents of the reactor were then warmed to 40° C. A shot of a 0.06 M solution of sec-butyllithium in cyclohexane was then rapidly added to the reactor via cannula, causing the reactor contents to turn yellow-orange. The reactor contents were allowed to stir for 30 minutes. A small portion of the reactor contents was then withdrawn from the reactor into a small round bottomed flask containing anhydrous methanol for gel permeation chromatography analysis of the polystyrene block formed. Then a solution of freshly sublimed hexamethylcyclotrisiloxane in cyclohexane was transferred to the reactor. The reactor contents were allowed to react for 20 hours. Then dry tetrahydrofuran was added to the reactor and the reaction was allowed to proceed for 7 hours. Chlorotrimethylsilane (1 mL) was then added to the reactor to quench the reaction. The product was isolated by precipitating into 1 L of methanol and filtering. After washing with additional methanol, the polymer was redissolved in 150 mL of methylene chloride, washed twice with deionized water and then reprecipitated into 1 L of methanol. The polymer was then filtered and dried overnight in a vacuum oven at 60° C.

Synthesis of Hydroxyl-Terminated Poly(Methyl Methacrylate-Ran-Trifluoroethyl Methacrylate)

A random copolymer comprising poly(methyl methacrylate-ran-trifluoroethyl methacrylate) was manufactured with a reactive alcohol end group by adding to a Schlenk flask equipped with a magnetic stirring bar, 4,4'-di-tert-butyl-2,2'-bipyridyl (0.537 g), Cu(I)Br (0.144 g), methyl methacrylate (7.00 g), trifluoroethyl methacrylate (3.00 g), and toluene (10 g). The solution was sparged with argon for 15 minutes and then placed in a preheated oil bath at 90° C. Once the solution had come to equilibrium, the initiator (2-hydroxyethyl 2-bromo-2-methylpropanoate) (0.211 g) was added via syringe and the reaction was stirred at 90° C. After the polymerization was quenched, the mixture was diluted with THF and stirred with ion exchange beads to remove the catalyst. Once the solution was clear, it was filtered, concentrated to 50 wt %, and precipitated into excess cyclohexane. The polymer was collected and dried in a vacuum oven at 60° C. overnight. $^1$H NMR showed the polymer to have a composition of 69 wt % methyl methacrylate and 31 wt % trifluoroethyl methacrylate. Gel-permeation chromatography revealed a number-average molecular weight of 13.9 kg/mol relative to polystyrene (PS) standards and polydispersity index, Mw/Mn, of 1.20.

This example depicts the manufacturing and use of a composition comprising polystyrene-block polydimethylsiloxane copolymers (PS-b-PDMS) of 32 nm domain spacing (PS-b-PDMS-32). The composition is shown in the Table 1.

The composition as seen in the Table 1 comprises a first block copolymer PS-b-PDMS having a number average molecular weight indicated by 13.5-b-13.5 kg/mol, a second block copolymer PS-b-PDMS having a number average molecular weight indicated by 6.3-b-1.9 kg/mol, a third block copolymer PS-b-PDMS having a number average molecular weight indicated by 7-b-1.5 kg/mol, a first polymer (PS) of number average molecular weight of 6.0 kg/mol, a second polymer (PDMS) of a number average molecular weight of 2.4 kg/mol, and another second polymer (PDMS) of a number average molecular weight of 6.0 kg/mol. This nomenclature is used in the Tables 2 and 3 below.

TABLE 1

| Polymer Name | Composition/Mn (kg/mol) | Wt % in composition | PDI* |
|---|---|---|---|
| PS-b-PDMS | 13.5-b-13.5 | 45 | 1.01 |
| PS-b-PDMS | 6.3-b-1.9 | 14 | 1.1 |
| PS-b-PDMS | 7-b-1.5 | 14 | 1.12 |
| PS | 6.0 | 8 | 1.05 |
| PDMS | 2.4 | 10 | 1.09 |
| PDMS | 6.0 | 9 | 1.15 |

*PDI = polydispersity index

A silicon substrate with native oxide was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen. The substrate was then puddled with PGMEA for 1 minute and spun dry at 3000 rpm for 1 minute. PS-b-PDMS-32 was dissolved in 1,3-dioxolane to form a 0.6 wt % solution. The solution was then spin-coated at 2,000 rpm onto the brushed substrate described above.

Figure 3:
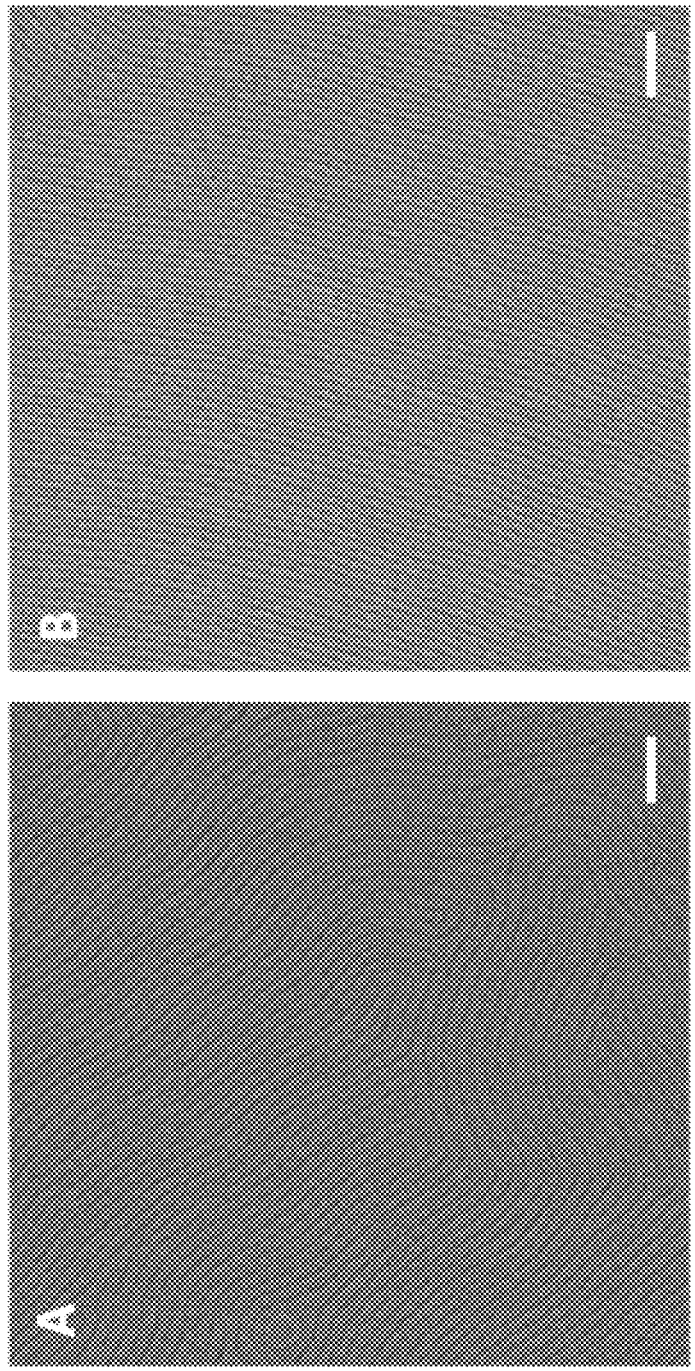
FIG. 3 shows photomicrographs of a formulated perpendicular lamellar PS-b-PDMS at 32 nm pitch (A) and 22 nm pitch (B)

The coated film was baked at 110° C. for 1 minute and annealed at 340° C. for 15 minutes under nitrogen. After thermal annealing, the films were subjected to two reactive ion etching steps using a PlasmaTherm 790i RIE, an 8 second CF$_4$ reactive ion etch (50 standard cubic centimeters (sccm), 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The morphology is shown in the photomicrograph of the FIG. 3(A).

Example 2

This example shows the use of a composition that comprises PS-b-PDMS composition of 22 nm domain spacing (PS-b-PDMS-22) prepared according to Table 2.

TABLE 2

| Polymer Name | Composition/Mn (kg/mol) | wt % in composition | PDI |
|---|---|---|---|
| PS-b-PDMS | 5.3-b-9.5 | 45 | 1.02 |
| PS-b-PDMS | 5.2-b-1.4 | 28 | 1.14 |
| PS | 6.0 | 8 | 1.05 |
| PDMS | 2.2 | 10 | 1.09 |
| PDMS | 3.5 | 9 | 1.12 |

A silicon substrate with native oxide was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen. The substrate was then puddle with PGMEA for 1 minute and spun dry at 3000 rpm for 1 minute. PS-b-PDMS-22 was dissolved in 1,3-dioxolane to form a 0.6 wt % solution. The solution was then spun-coated at 3,000 rpm onto the brushed substrate described above.

The coated film was baked at 110° C. for 1 min and annealed at 340° C. for 15 minutes under nitrogen. After thermal annealing, the films were subjected to two reactive ion etching steps using a PlasmaTherm 790i RIE, an 8 second CF4 reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The morphology is shown in the photomicrograph of the FIG. 3(B).

Example 3: Chemoepitaxy of PS-b-PDMS at 32 nm Pitch

This example depicts the manufacturing and use of a polystyrene-block polydimethylsiloxane copolymers (PS-b-PDMS) composition of 32 nm domain spacing (PS-b-PDMS-32) prepared according to Table 1.

Chemical patterned substrate was prepared by spin coating 1.2 wt % (solids) solutions of hydroxyl-terminated poly(methyl methacrylate-ran-trifluoroethyl methacrylate) in propylene glycol methyl ether acetate (PGMEA) at 1,500 rpm for 1 minute on the chemoepitaxy templates with isolated polystyrene stripes (90 nm pitch, 15 nm critical dimension (CD) prepared using methods described in Liu et al. in Macromolecules, 2011, 44 (7), pp 1876-1885. The templated substrate was baked at 150° C. for 1 min and annealed at 250° C. under nitrogen for 5 minutes.

Figure 4:
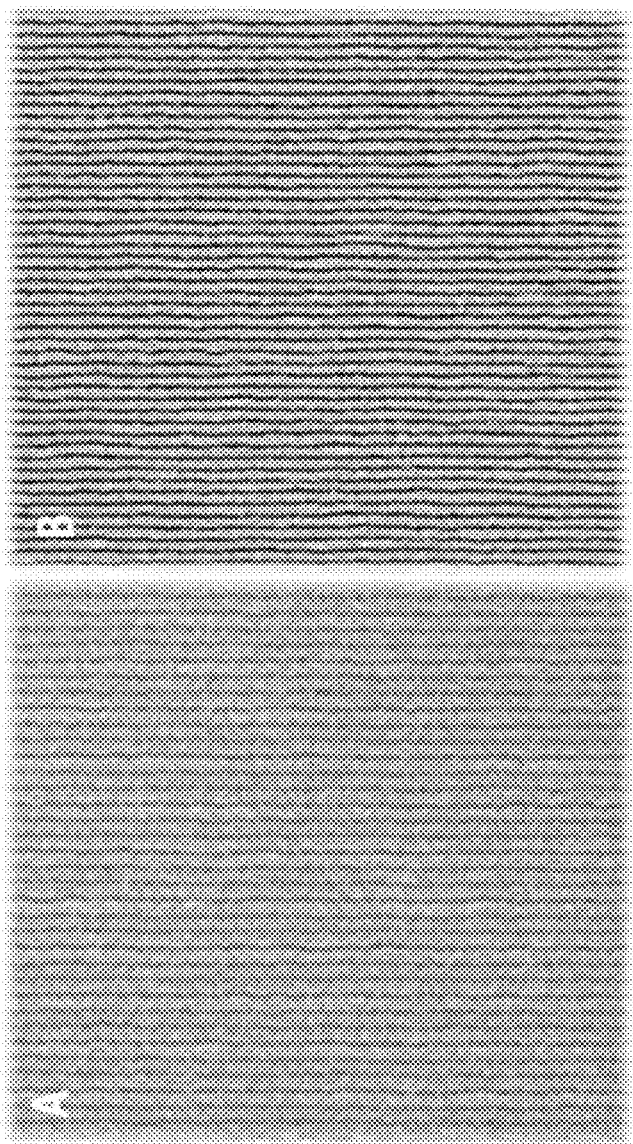
FIG. 4 shows photomicrographs of the chemoepitaxy of PS-b-PDMS at 32 nm pitch (A) and 22 nm pitch (B)

The substrate was then soaked in PGMEA for 1 minute, spun dry at 3,000 rpm for 1 minute and baked at 150° C. for 1 minute. PS-b-PDMS-32 was dissolved in 1,3-dioxolane to form a 0.6 wt % solution. The solution was then spin-coated at 2,000 rpm onto the chemical patterned substrate described above. The coated film was baked at 110° C. for 1 minute and annealed at 340° C. for 15 minutes under nitrogen. After thermal annealing, the films were subjected to two reactive ion etching steps using a PlasmaTherm 790i RIE, an 8 second CF$_4$ reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The morphology is shown in the photomicrograph of the Figure FIG. 4(A).

Example 4: Chemoepitaxy of PS-b-PDMS at 22 nm Pitch

This example depicts the manufacturing and use of a polystyrene-block polydimethylsiloxane copolymers (PS-b-PDMS) composition of 22 nm domain spacing (PS-b-PDMS-22) was prepared according to Table 2.

Chemical patterned substrate was prepared by spin coating 1.2 wt % (solids) solutions of hydroxyl-terminated poly(methyl methacrylate-ran-trifluoroethyl methacrylate) in PGMEA at 1,500 rpm for 1 minute on the chemoepitaxy templates with isolated polystyrene stripes (110 nm pitch, 12 nm CD) prepared using methods described in Liu et al. in Macromolecules, 2011, 44 (7), pp 1876-1885. The templated substrate was baked at 150° C. for 1 min and annealed at 250° C. under nitrogen for 5 minutes. The substrate was then soaked in PGMEA for 1 minute, spun dry at 3,000 rpm for 1 minute and baked at 150° C. for 1 minute. PS-b-PDMS-22 was dissolved in 1,3-dioxolane to form a 0.6 wt % solution. The solution was then spin-coated at 3,000 rpm onto the chemical patterned substrate described above. The coated film was baked at 110° C. for 1 minute and annealed at 340° C. for 2 minutes under nitrogen. After thermal annealing, the films were subjected to two reactive ion etching steps using a PlasmaTherm 790i RIE, an 8 second $CF_4$ reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The morphology is shown in the photomicrograph of the FIG. 4(B).

Comparative Example 1. Neat Lamellar PS-b-PDMS at 28 nm Pitch

Silicon substrate with native oxide was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen. The substrate was then puddled with PGMEA for 1 minute and spun dry at 3000 rpm for 1 minute. Neat PS-b-PDMS of 28 nm domain spacing was dissolved in 1,3-dioxolane to form a 0.6 wt % solution.

Figure 5:
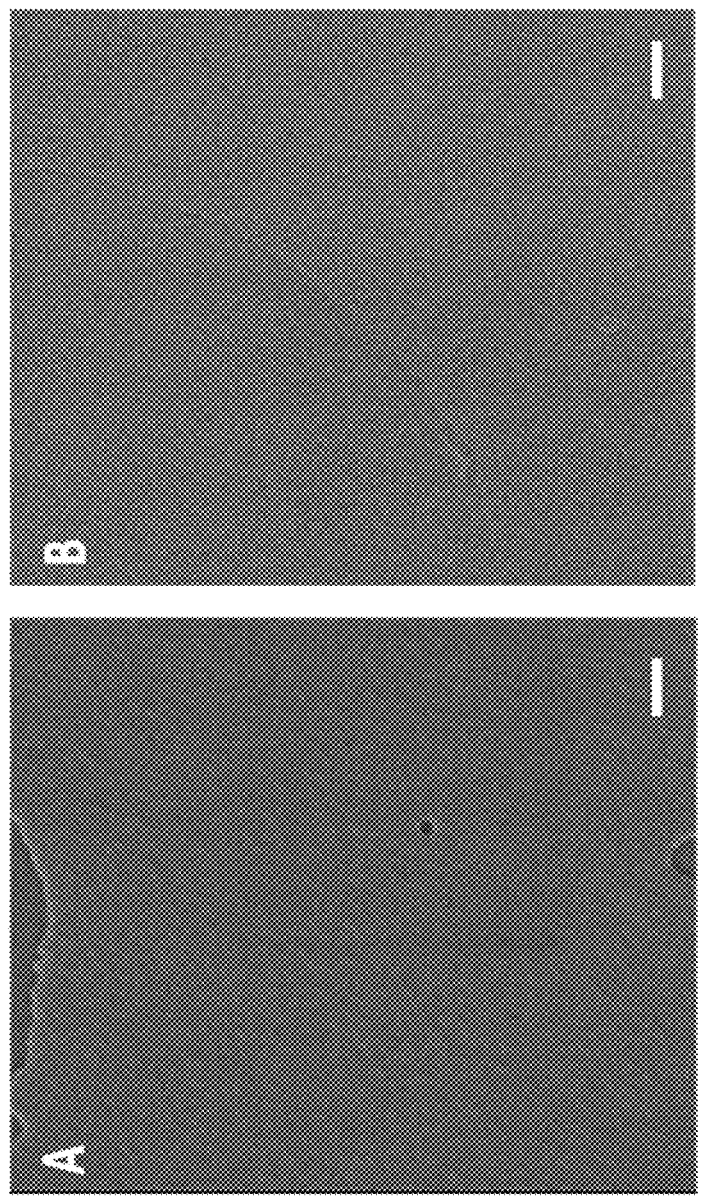
FIG. 5 shows photomicrographs of neat PS-b-PDMS at 28 nm pitch (A) and 18 nm pitch (B)

The solution was then spin-coated at 2,000 rpm onto the brushed substrate described above. The coated film was baked at 110° C. for 1 minute and annealed at 340° C. for 15 minutes under nitrogen. After thermal annealing, the films were subjected to two reactive ion etching steps using a PlasmaTherm 790i RIE, an 8 second $CF_4$ reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The morphology is shown in the photomicrograph of the FIG. 5(A).

Comparative Example 2. Neat Lamellar PS-b-PDMS at 18 nm Pitch

Silicon substrate with native oxide was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen. The substrate was then puddle with PGMEA for 1 minute and spun dry at 3000 rpm for 1 minute.

Neat PS-b-PDMS of 28 nm domain spacing was dissolved in 1,3-dioxolane to form a 0.6 wt % solution. The solution was then spin-coated at 2,000 rpm onto the brushed substrate described above. The coated film was baked at 110° C. for 1 min and annealed at 340° C. for 15 minutes under nitrogen. After thermal annealing, the films were subjected to two reactive ion etching steps using a PlasmaTherm 790i RIE, an 8 second $CF_4$ reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The morphology is shown in the photomicrograph of the FIG. 5(B).

Example 5. Chemoepitaxy of Formulated PS-b-PDMS

The compositions 1 to 3 (comprising PS-b-PDMS) were prepared according to Table 3 (below). The compositions included a first block copolymer (PS-b-PDMS), a second block copolymer (PS-b-PDMS), a polystyrene (PS) homopolymer and a polydimethylsiloxane (PDMS) homopolymer. The first block copolymer (PS-b-PDMS), the polystyrene (PS) homopolymer and the polydimethylsiloxane (PDMS) homopolymer components in the composition were the same in compositions 1-3, while the second block copolymer PS-b-PDMS components varied in their average weight fraction of PDMS in the block copolymer. Average weight fractions of PDMS in the minor block copolymer were 14%, 30% and 20% respectively for composition 1, 2 and 3 respectively.

Chemically patterned substrates were prepared by spin coating 1.2 wt % (solids) solutions of hydroxyl-terminated poly(methyl methacrylate-ran-trifluoroethyl methacrylate) in propylene glycol methyl ether acetate (PGMEA) at 1,500 revolutions per minute (rpm) for 1 minute on the chemoepitaxy templates with isolated polystyrene stripes (90 nm pitch, 15 nm CD) prepared using methods described in Liu et al. in Macromolecules, 2011, 44 (7), pp 1876-1885.

The templated substrate was baked at 150° C. for 1 minute and annealed at 250° C. under nitrogen for 5 minutes. The substrate was then soaked in PGMEA for 1 minute, spun dry at 3,000 rpm for 1 minute and baked at 150° C. for 1 minute.

Compositions 1 through 3 were dissolved in 1,3-dioxolane to form a 0.6 wt % solution. The solution was then spin-coated at 2,000 rpm onto the chemical patterned substrate described above. The coated film was baked at 110° C. for 1 minute and annealed at 340° C. for 15 minutes under nitrogen. After thermal annealing, the films were subjected to two reactive ion etching steps using a PlasmaTherm 790i RIE, an 8 second $CF_4$ reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The respective morpholobies are seen in the FIGS. 6(A)-(C), which are discussed in detail below. Directed self-assembly data of the three compositions suggested that 1) When the weight fraction of PDMS in the minor PS-b-PDMS was low (14%), cylindrical morphology instead of lamellae was observed as the lines were not directed by the chemical patterns. (See FIG. 6(A).)

2) When the weight fraction of PDMS in the minor PS-b-PDMS was high (30%), partial parallel orientations were observed. (See FIG. 6(B).)
3) When the weight fraction of PDMS in the minor PS-b-PDMS was 20%, good directed self-assembly results were observed. (See FIG. 6(C).)

Example 6. Undirected Self Assembly of Formulated PS-b-PDMS

Compositions 4 through 6 (that comprise the first and second PS-b-PDMS block copolymers) are shown in the Table 3 (below). The first block copolymer PS-b-PDMS, second block copolymer PS-b-PDMS, and PS homopolymer components in the composition were the same for compositions 4-6, while the PDMS homopolymer components varied in their molecular weights. The molecular weights of PDMS homopolymer were 1.7, 5.2 and 2.8 kg/mol respectively for compositions 4, 5 and 6 respectively. Silicon substrate with a native oxide disposed thereon was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen.

The substrate was then puddled with PGMEA for 1 minute and spun dry at 3000 rpm for 1 minute. Compositions 4 through 6 were each separately dissolved in 1,3-dioxolane to form a 0.6 wt % solution. The solution was then spun-coated at 2,000 rpm onto the brushed substrate described above. The coated film was baked at 110° C. for 1 minute and annealed at 340° C. for 15 minutes under nitrogen. After thermal annealing, the films were subjected to two reactive ion etching steps using a PlasmaTherm 790i RIE, an 8 second $CF_4$ reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. The morphology is depicted in the micrographs seen in the FIGS. 6(D)-(F) respectively. Undirected self-assembly data of the three compositions suggested that 4) When the molecular weight of PDMS homopolymer was low (1.7 kg/mol), there were significant non-uniformity in the lines and spaces of the fingerprints, which led to undesirable high line width roughness. (See FIG. 6(D).)
5) When the molecular weight of PDMS homopolymer was high (5.2 kg/mol), partial parallel orientations were observed. (See FIG. 6(E).)
6) When the molecular weight of PDMS homopolymer was 2.8 kg/mol, fingerprint patterns of good quality were observed. (See FIG. 6(F).)

Example 7. Undirected Self Assembly of Formulated PS-b-PDMS

Compositions 7 through 9 are shown in the Table 3. The first block copolymer PS-b-PDMS, PS homopolymer and PDMS homopolymer components in the compositions 7-9 were the same, while the minor PS-b-PDMS components varied in their molecular weights in the respective compositions. The molecular weights of the minor block copolymers were 4.7, 17.5 and 8.2 kg/mol respectively for compositions 7, 8 and 9.

Silicon substrate with native oxide was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen. The substrate was then puddle with PGMEA for 1 minute and spun dry at 3000 rpm for 1 minute. PS-b-PDMS composition 4-6 was dissolved in 1,3-dioxolane to form a 0.6 wt % solution. The solution was then spin-coated at 2,000 rpm onto the brushed substrate described above. The coated film was baked at 110° C. for 1 min and annealed at 340° C. for 15 minutes under nitrogen. After thermal annealing, the films were subjected to two reactive ion etching steps using a PlasmaTherm 790i RIE, an 8 second $CF_4$ reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology. Micrographs in FIGS. 6(G)-(I) respectively depict the morphology. Undirected self-assembly data of the three compositions suggested that 7) When the molecular weight of minor PS-b-PDMS was low (4.7 kg/mol), parallel orientations were observed. (See FIG. 6(G).)
8) When the molecular weight of minor PS-b-PDMS was high (17.5 kg/mol), partial parallel orientations were observed. (See FIG. 6(H).)
9) When the molecular weight of minor PS-b-PDMS was 8.2 kg/mol, fingerprint patterns of good quality were observed. (See FIG. 6(I).)

Example 8. Undirected Self Assembly of Formulated PS-b-PDMS

Compositions 10 through 12 are shown in the Table 3. The first block copolymer PS-b-PDMS components in the compositions 10 through 12 were similar (53-55%), while the weight fraction of the other three components in the composition varied one at a time. The weight fraction of the minor PS-b-PDMS components decreased from 28% (optimized value) to 18% in composition 10. The weight fraction of the PDMS homopolymer components decreased from 19% (optimized value) to 10% in composition 11. The weight fraction of the PS homopolymer components decreased from 8% (optimized value) to 0% in composition 12. Silicon substrate with native oxide was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen. The substrate was then puddle with PGMEA for 1 minute and spun dry at 3000 rpm for 1 minute. PS-b-PDMS composition 4-6 was dissolved in 1,3-dioxolane to form a 0.6 wt % solution. The solution was then spin-coated at 2,000 rpm onto the brushed substrate described above. The coated film was baked at 110° C. for 1 min and annealed at 340° C. for 15 mins under nitrogen. After thermal annealing, the films were subjected to two reactive ion etching steps using a PlasmaTherm 790i RIE, an 8 second CF4 reactive ion etch (50 sccm, 100 watts) followed by a 25 second oxygen reactive ion etch (25 sccm, 180 watts) to remove the PS and oxidize the PDMS block. The samples were then imaged by scanning electron microscopy (AMRAY 1910 Field Emission) at 50K magnification to characterize the morphology (See FIGS. 6(J)-(L) respectively). Undirected self assembly data of the three compositions suggested that 10) When the weight fraction of the minor PS-b-PDMS components decrease from 28% to 18%, parallel orientations were observed. (See FIG. 6(J).)
11) When the weight fraction of the PDMS homopolymer components decreased from 19% to 10%, cylindrical morphology instead of lamellae was observed. (See FIG. 6(K).)
12) When the weight fraction of the PS homopolymer components decreased from 8% to 0%, partial parallel orientation as well as fingerprints of poor quality were observed. (See FIG. 6(L).)

TABLE 3

Figure 6:
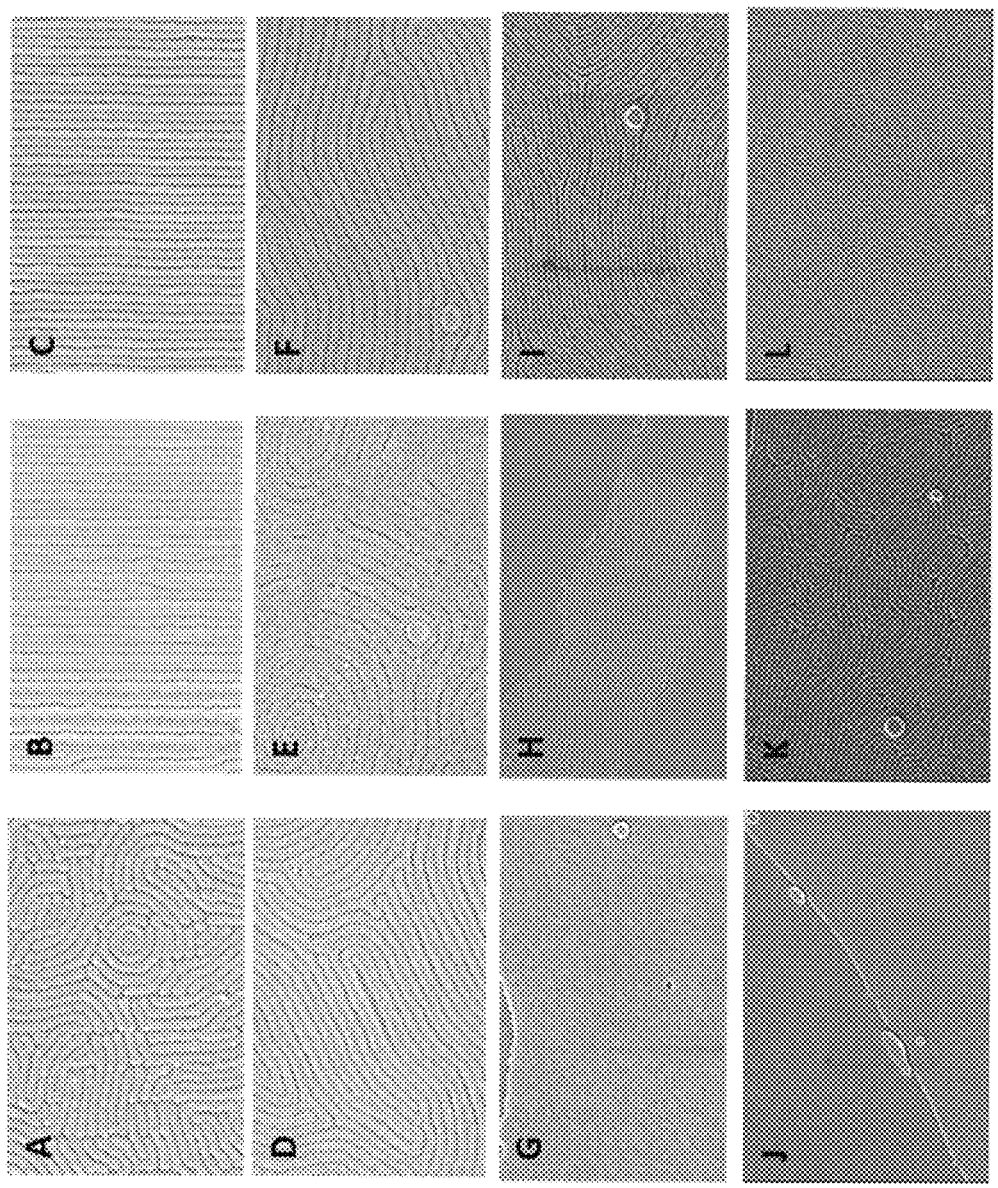
FIG. 6 shows photomicrographs of the composition for compositions 1-12 of the Examples 5 through 8.

|  | | Major PS-b-PDMS | Minor PS-b-PDMS | Minor PS-b-PDMS | homo PS | homo PDMS |
|---|---|---|---|---|---|---|
| Composition 1 | FIG. 6A | 13.5-b-13.5*, 50% | 13.2-b-1.6, 15% | 11.3-b-2.5, 15% | 8, 10% | 7, 20% |
| Composition 2 | FIG. 6B | 13.5-b-13.5, 50% | 9.2-b-5, 15% | 13.5-b-4, 15% | 8, 10% | 7, 20% |
| Composition 3 | FIG. 6C | 13.5-b-13.5, 50% | 13.5-b-4, 15% | 11.3-b-2.5, 15% | 8, 10% | 7, 20% |
| Composition 4 | FIG. 6D | 13.5-b-13.5, 45% | 7-b-1.5, 14% | 6.3-b-1.9, 14% | 6.4, 8% | 1.7, 19% |
| Composition 5 | FIG. 6E | 13.5-b-13.5, 45% | 7-b-1.5, 14% | 6.3-b-1.9, 14% | 6.4, 8% | 5.2, 19% |
| Composition 6 | FIG. 6F | 13.5-b-13.5, 45% | 7-b-1.5, 14% | 6.3-b-1.9, 14% | 6.4, 8% | 2.8, 19% |
| Composition 7 | FIG. 6G | 13.5-b-13.5, 45% | 3.8-b-0.9, 28% |  | 6.4, 8% | 3.5, 19% |
| Composition 8 | FIG. 6H | 13.5-b-13.5, 45% | 13.5-b-4, 28% |  | 6.4, 8% | 3.5, 19% |
| Composition 9 | FIG. 6I | 13.5-b-13.5, 45% | 6.3-b-1.9, 28% |  | 6.4, 8% | 3.5, 19% |
| Composition 10 | FIG. 6J | 13.5-b-13.5, 55% | 6.3-b-1.9, 18% |  | 6.4, 8% | 3.5, 19% |
| Composition 11 | FIG. 6K | 13.5-b-13.5, 54% | 6.3-b-1.9, 28% |  | 6.4, 8% | 3.5, 10% |
| Composition 12 | FIG. 6L | 13.5-b-13.5, 53% | 6.3-b-1.9, 28% |  |  | 3.5, 19% |

In the Table 3, the respective block number average molecular weights are in kilograms per mole, while the percents are weight percents.

Example 9. Undirected Self Assembly of Formulated PS-b-PDMS

This example depicts the manufacturing and use of composition 3 (Table 3) to understand the morphology of the film.

A silicon substrate with native oxide was treated by spin-coating a hydroxyl-terminated poly(methyl methacrylate-ran-trifluoroethyl methacrylate) in propylene glycol monomethyl ether acetate (PGMEA) followed by a soft bake at 150° C. for 1 minute and thermal annealing at 250° C. for 5 minutes under nitrogen. The substrate was then puddled with PGMEA for 1 minute and spun dry at 3000 rpm for 1 minute. Composition 3 was dissolved in 1,3-dioxolane to form a 0.6 wt % solution. The solution was then spin-coated at 1,000 rpm onto the brushed substrate described above to obtain film thickness of 40 nm.

Figure 7:
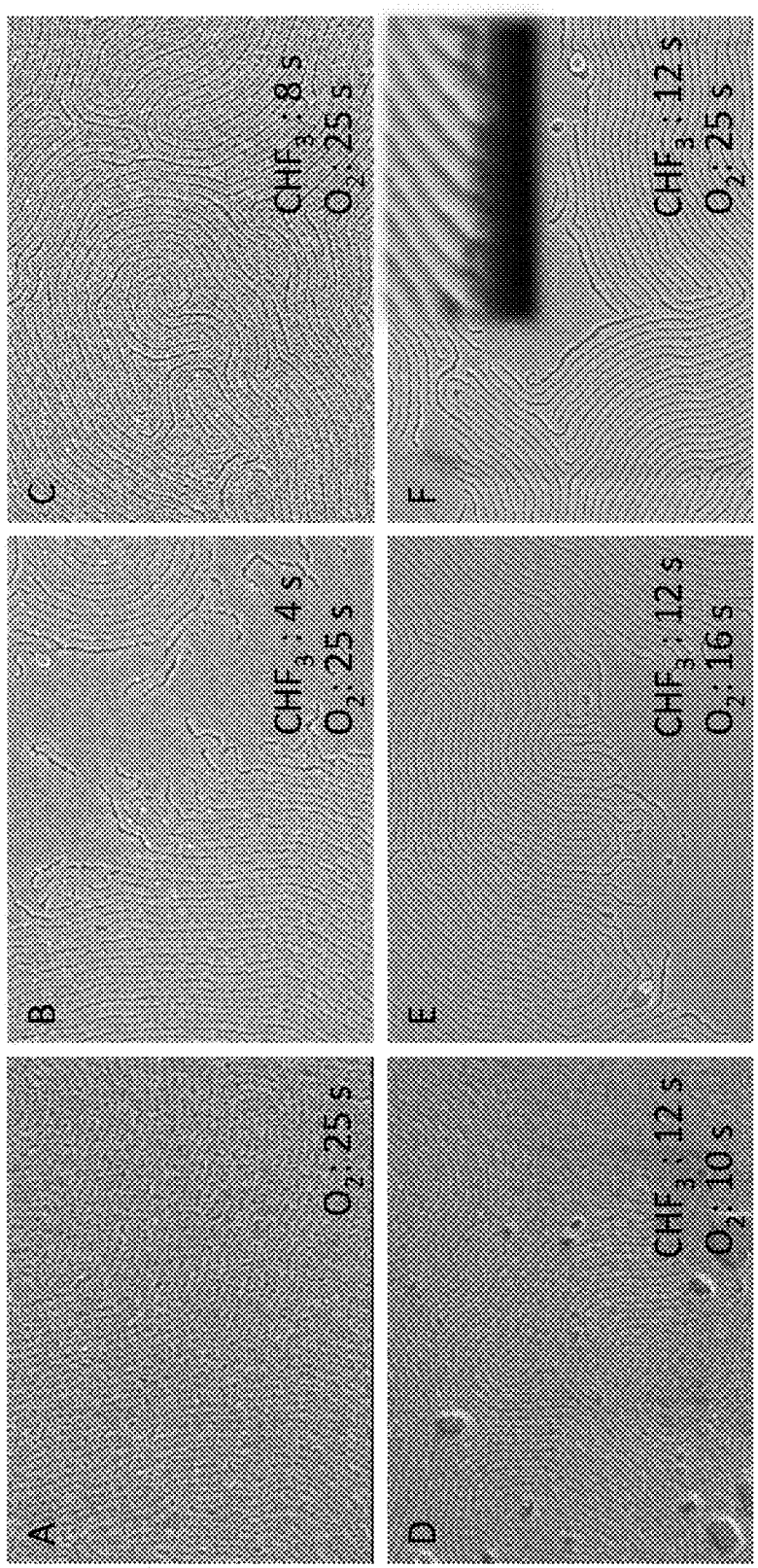
FIG. 7 shows photomicrographs of the composition 3 of Example 9 with different etching exposures.

The coated film was baked at 110° C. for 1 minute and annealed at 340° C. for 5 minutes under nitrogen. After thermal annealing, the films were subjected to six different reactive ion etching recipes (Table 4) using a PlasmaTherm 790i RIE. $CHF_3$ reactive ion etch was performed at 50 standard cubic centimeters (sccm), 100 watts to remove Si. $O_2$ reactive ion etch was performed at 25 sccm, 180 watts to remove the rest of organic components in the polymer. The etch rates of $CHF_3$ and $O_2$ on PDMS and PS respectively were determined by etching blanket film of PDMS or PS individually, shown in Table 5. The samples were then imaged by scanning electron microscopy (AMRAY 1910 Field Emission) at 50K magnification to characterize the morphology of the film, i.e. the thickness of the parallel lamellae on the top of the film. The morphology is shown in the photomicrograph of the FIG. 7. In recipe 1, 2, 3 and 6, duration of $O_2$ etch was fixed at 25 seconds, while duration of $CHF_3$ varied from 0 to 12 seconds to determine the thickness of PDMS on the top of the film. When no $CHF_3$ etch was performed, fingerprints were observed but not clear due to remaining silicon from PDMS wetting layer covering on the fingerprint (FIG. 7A). After 4 seconds and 8 seconds of $CHF_3$ etch, remaining Si was still observed (shown in FIGS. 7B and 7C), while after 12 sec of $CHF_3$ etch, the fingerprints were completely clear suggesting PDMS was completely removed (shown in FIG. 7F). It was estimated that the PDMS layer was completely removed after 10 sec of $CHF_3$ etch, suggesting PDMS layer was about 6.4 nm thick. In recipe 4 and 5, duration of $CHF_3$ etch was fixed at 12 sec, while duration of $O_2$ etch was varied to determine the thickness of the PS layer next to the PDMS on the top and right above the perpendicular lamellae. After 10 sec of $O_2$ etch, fingerprints started to reveal (FIG. 7D), while after 16 sec of $O_2$ etch, fingerprints were clearly observed (FIG. 7E). The time required to remove the entire wetting layer was estimated to be 12 sec. Since it took 8 sec to remove the organic components in 6.4 nm of PDMS layer and another 4 sec to remove the PS, the PS layer was about 7.0 nm thick. The entire wetting layer, denoted $T_a$, was estimated to be 13.4 nm thick, which is close to 0.5 $L_0$ of the pitch of this formulation (17 nm). The film thickness of the perpendicular lamellae at the bottom of the film, denoted $T_b$, was then estimated to be 26.6 nm, which was confirmed by the measurements in cross section SEM in the inset in FIG. 7F. According to the relationship in Equation 1:

$$T_a = T_c - KL_0 \quad (1)$$

$T_a$=26.6 nm, $T_b$=13.4 nm, and $T_c$ 40 nm, so K=0.41.

TABLE 4

|  |  | $CHF_3$ duration (s) | $O_2$ duration (s) |
|---|---|---|---|
| Etch recipe 1 | FIG. 7A | 0 | 25 |
| Etch recipe 2 | FIG. 7B | 4 | 25 |
| Etch recipe 3 | FIG. 7C | 8 | 25 |
| Etch recipe 4 | FIG. 7D | 12 | 10 |
| Etch recipe 5 | FIG. 7E | 12 | 16 |
| Etch recipe 6 | FIG. 7F | 12 | 25 |

TABLE 5

|  | $CHF_3$ Etch Rate (nm/s) | $O_2$ Etch Rate (nm/s) |
|---|---|---|
| PDMS | 0.64 | 0.23 |
| PS | 0.81 | 1.77 |

What is claimed is:

1. A composition comprising:
a first block copolymer that comprises a first block and a second block; where the first block has a higher surface energy than the second block;
a second block copolymer that comprises a first block and a second block; where the first block of the first block copolymer is chemically the same as or similar to the first block of the second block copolymer and the second block of the first block copolymer is chemically the same as or similar to the second block of the second block copolymer; where the weight percent based on total solids of the first block of the second block copolymer is greater than that of the first block of the first block copolymer;
where the first block copolymer phase separates into a first morphology of cylindrical or lamellar domains when disposed singly on a substrate; where the second block copolymer phase separates into a second morphology of cylindrical, lamellar or spherical domains when singly disposed on a substrate; and where the first morphology and the second morphology are different; and
a first polymer that is chemically the same as or similar to the first block of the first block copolymer and to the first block of the second block copolymer; and
a second polymer that is chemically the same as or similar to the second block of the first block copolymer and to the second block of the second block copolymer; where the first and the second block copolymer have a chi parameter greater than 0.04 at a temperature of 200° C.

2. The composition of claim 1, where the first polymer is chosen from a homopolymer or random copolymer.

3. The composition of claim 1, where the first and the second polymer are homopolymers.

4. The composition of claim 1, where the first polymer and the second polymer are present in a combined amount of less than 40 wt % based on total solids of the composition.

5. The composition of claim 1, where the first block of the first block copolymer comprises a polystyrene, a poly(meth)acrylate, a polyolefin, a polyacrylic, a polycarbonate, a polyester, a polyamide, a polyamideimide, a polyvinyl ether, a polyvinyl thioether, a polyvinyl alcohol, a polyurea, a poly(vinyl pyridine), a poly(vinyl imidazole), a poly(vinyl pyrazole), or a combination thereof.

6. The composition of claim 1, where the first block of the first block copolymer comprises polystyrene or polymethylmethacrylate and where the second block of the first block copolymer comprises polydimethylsiloxane.

7. The composition of claim 1, where the second block of the first block copolymer comprises a structure represented by formula (1)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl and where a degree of polymerization n in the formula (1) is 10 to 5,000.

8. The composition of claim 1, where the composition comprises cylindrical and/or lamellar domains and has an interdomain spacing of less than or equal to about 25 nanometers after being cast on the substrate and being annealed at a temperature above the glass transition temperature and below the order-disorder transition temperature and the decomposition temperature.

9. The method of forming a pattern comprising:
disposing upon a substrate a composition comprising:
a first block copolymer that comprises a first block and a second block; where the first block has a higher surface energy than the second block;
a second block copolymer that comprises a first block and a second block; where the first block of the first block copolymer is chemically the same as or similar to the first block of the second block copolymer and the second block of the first block copolymer is chemically the same as or similar to the second block of the second block copolymer; where the weight percent based on total solids of the first block of the second block copolymer is greater than that of the first block of the first block copolymer; where the first block copolymer phase separates into a first morphology of cylindrical or lamellar domains when disposed singly on a substrate; where the second block copolymer phase separates into a second morphology of cylindrical, lamellar or spherical domains when singly disposed on a substrate; and where the first morphology and the second morphology are different; and
a first polymer that is chemically the same as or similar to the first block of the first block copolymer and to the first block of the second block copolymer; and
a second polymer that is chemically the same as or similar to the second block of the first block copolymer and to the second block of the second block copolymer; where the first and the second block copolymer have a chi parameter greater than 0.04 at a temperature of 200° C.;
annealing the substrate; and
removing a portion of the composition to form a pattern.

10. The method of claim 9, where the substrate comprises a pattern that directs the composition to form lamellar or cylindrical domains registered to the pattern on the substrate after annealing.

* * * * *